(12) United States Patent
Shin et al.

(10) Patent No.: US 7,999,718 B2
(45) Date of Patent: Aug. 16, 2011

(54) ANALOG-TO-DIGITAL CONVERTER AND ELECTRONIC SYSTEM INCLUDING THE SAME

(75) Inventors: Eun Seok Shin, Hwasung-si (KR); Min Kyu Song, Seongnam-si (KR); Jun Ho Moon, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/689,683

(22) Filed: Jan. 19, 2010

(65) Prior Publication Data
US 2010/0182184 A1     Jul. 22, 2010

(30) Foreign Application Priority Data
Jan. 21, 2009  (KR) .................. 10-2009-0004944

(51) Int. Cl.
     *H03M 1/36* (2006.01)
(52) U.S. Cl. .................. 341/160; 327/57
(58) Field of Classification Search .......... 341/115–155; 327/57–103; 326/39, 41
     See application file for complete search history.

(56) References Cited

U.S. PATENT DOCUMENTS

| | | | |
|---|---|---|---|
| 5,164,728 A | | 11/1992 | Matsuzawa et al. |
| 5,307,067 A | * | 4/1994 | Kimura et al. .............. 341/159 |
| 5,309,157 A | * | 5/1994 | Yee .............................. 341/156 |
| 5,376,937 A | * | 12/1994 | Colleran et al. ............. 341/159 |
| 5,617,092 A | * | 4/1997 | Pace ............................ 341/159 |
| 6,043,676 A | * | 3/2000 | Mendel et al. ............... 326/39 |
| 6,114,885 A | * | 9/2000 | Yang et al. .................. 327/112 |
| 6,175,323 B1 | * | 1/2001 | Flynn .......................... 341/156 |
| 6,411,246 B2 | * | 6/2002 | Nagaraj ...................... 341/158 |
| 6,452,529 B1 | * | 9/2002 | Li ................................ 341/156 |
| 6,985,097 B2 | * | 1/2006 | Ueno et al. ................. 341/118 |
| 7,405,691 B2 | * | 7/2008 | Makigawa et al. .......... 341/159 |
| 7,696,917 B2 | * | 4/2010 | Matsuura et al. ............ 341/160 |

FOREIGN PATENT DOCUMENTS

| | | |
|---|---|---|
| JP | 2003-218698 | 7/2003 |
| KR | 1020020022159 | 3/2002 |
| KR | 1020070109856 | 11/2007 |

* cited by examiner

*Primary Examiner* — Lam T Mai

(74) *Attorney, Agent, or Firm* — F. Chau & Associates, LLC

(57) ABSTRACT

An analog-to-digital converter includes a first logic unit and a second logic unit. The first logic unit is configured to receive a plurality of thermometer codes and inverse thermometer codes generated based on an analog signal received by the analog-to-digital converter and to generate a plurality of first digital codes that periodically repeat the same pattern based on a transition position of a logic value in each of the thermometer codes and the inverse thermometer codes. The second logic unit is configured to receive the plurality of first digital codes and to generate a plurality of second digital codes based on logic values of a plurality of bits among all bits of each of the first digital codes.

5 Claims, 13 Drawing Sheets

FIG. 4

| b1 | b2 | b3 | b4 |
|----|----|----|----|
| 1  | 1  | 1  | 1  |
| 0  | 1  | 1  | 1  |
| 0  | 0  | 1  | 1  |
| 0  | 0  | 0  | 1  |
| 0  | 0  | 0  | 0  |
| 1  | 0  | 0  | 0  |
| 1  | 1  | 0  | 0  |
| 1  | 1  | 1  | 0  |
| 1  | 1  | 1  | 1  |
| 0  | 1  | 1  | 1  |
| 0  | 0  | 1  | 1  |
| 0  | 0  | 0  | 1  |
| 0  | 0  | 0  | 0  |

OUTPUTS OF COMPARISON BLOCK

FIG. 6

| | | | |
|---|---|---|---|
| 0 | 0 | 0 | 1 |
| 1 | 0 | 0 | 0 |
| 0 | 1 | 0 | 0 |
| 0 | 0 | 1 | 0 |
| 0 | 0 | 0 | 1 |
| 1 | 0 | 0 | 0 |
| 0 | 1 | 0 | 0 |
| 0 | 0 | 1 | 0 |
| 0 | 0 | 0 | 1 |
| 1 | 0 | 0 | 0 |
| 0 | 1 | 0 | 0 |
| 0 | 0 | 1 | 0 |
| 0 | 0 | 0 | 1 |
| b1' | b2' | b3' | b4' |
| OUTPUTS OF FIRST LOGIC UNIT | | | |

FIG. 7B

| OUTPUTS OF FIRST LOGIC UNIT |||||||| OUTPUTS OF SECOND LOGIC UNIT |||
|---|---|---|---|---|---|---|---|---|---|
| b1' | b2' | b3' | b4' | b5' | b6' | b7' | b1" | b2" | b3" |
| 0 | 0 | 0 | 0 | 0 | 0 | 0 | 0 | 0 | 0 |
| 0 | 0 | 0 | 0 | 0 | 0 | 1 | 0 | 0 | 1 |
| 0 | 0 | 0 | 0 | 0 | 1 | 0 | 0 | 1 | 0 |
| 0 | 0 | 0 | 0 | 1 | 0 | 0 | 0 | 1 | 1 |
| 0 | 0 | 0 | 1 | 0 | 0 | 0 | 1 | 0 | 0 |
| 0 | 0 | 1 | 0 | 0 | 0 | 0 | 1 | 0 | 1 |
| 0 | 1 | 0 | 0 | 0 | 0 | 0 | 1 | 1 | 0 |
| 1 | 0 | 0 | 0 | 0 | 0 | 0 | 1 | 1 | 1 |

FIG. 7C

| OUTPUTS OF FIRST LOGIC UNIT | | | | | | | OUTPUTS OF SECOND LOGIC UNIT | | |
|---|---|---|---|---|---|---|---|---|---|
| b1' | b2' | b3' | b4' | b5' | b6' | b7' | b1" | b2" | b3" |
| 0 | 0 | 0 | 0 | 0 | 0 | 0 | 0 | 0 | 0 |
| 0 | 0 | 0 | 0 | 0 | 0 | 1 | 0 | 0 | 1 |
| 0 | 0 | 0 | 0 | 0 | 1 | 0 | 0 | 1 | 0 |
| 0 | 0 | 0 | 0 | 1 | 0 | 0 | 0 | 1 | 1 |
| 0 | 0 | 0 | 1 | 0 | 0 | 0 | 1 | 0 | 0 |
| 0 | 0 | 1 | 0 | 0 | 0 | 0 | 1 | 0 | 1 |
| 0 | 1 | 0 | 0 | 0 | 0 | 0 | 1 | 1 | 0 |
| 1 | 0 | 0 | 0 | 0 | 0 | 0 | 1 | 1 | 1 |

FIG. 7D

| OUTPUTS OF FIRST LOGIC UNIT | | | | | | | OUTPUTS OF SECOND LOGIC UNIT | | |
|---|---|---|---|---|---|---|---|---|---|
| b1' | b2' | b3' | b4' | b5' | b6' | b7' | b1'' | b2'' | b3'' |
| 0 | 0 | 0 | 0 | 0 | 0 | 0 | 0 | 0 | 0 |
| 0 | 0 | 0 | 0 | 0 | 0 | 1 | 0 | 0 | 1 |
| 0 | 0 | 0 | 0 | 0 | 1 | 0 | 0 | 1 | 0 |
| 0 | 0 | 0 | 0 | 1 | 0 | 0 | 0 | 1 | 1 |
| 0 | 0 | 0 | 1 | 0 | 0 | 0 | 1 | 0 | 0 |
| 0 | 0 | 1 | 0 | 0 | 0 | 0 | 1 | 0 | 1 |
| 0 | 1 | 0 | 0 | 0 | 0 | 0 | 1 | 1 | 0 |
| 1 | 0 | 0 | 0 | 0 | 0 | 0 | 1 | 1 | 1 |

ND ELECTRONIC SYSTEM INCLUDING THE
ANALOG-TO-DIGITAL CONVERTER AND ELECTRONIC SYSTEM INCLUDING THE SAME

CROSS-REFERENCE TO RELATED APPLICATIONS

This application claims priority under 35 U.S.C. §119(e) to Korean Patent Application No. 10-2009-0004944 filed, on Jan. 21, 2009, in the Korean Intellectual Property Office, the disclosure of which is incorporated by reference herein.

BACKGROUND

1. Technical Field

Embodiments of the present invention relate to a data processing technology, and more particularly, to an analog-to-digital converter (ADC), which converts an analog signal to a digital signal, and an electronic system including the same.

2. Discussion of Related Art

An ADC having a flash architecture uses a relatively large amount of power consumption and has a relatively large area, which limits the implementation of the ADC on a system-on-chip (SoC).

An ADC having a folding architecture uses less power and has a smaller area. Such a folding ADC includes a switching block to invert a thermometer code during encoding.

False operations of the switching block during high-speed data conversation may generate an error code in the ADC, thereby reducing the overall performance of the ADC. Further, as the resolution of the data conversion operations performed by the folding ADC increases, the folding ADC needs an increasing number of switching elements, which results in an increase in the size the chip area and an increase in the amount of power used.

Thus, there is a need for an ADC that uses less power and takes up less area, which can reduce false operations based on switching operations and an electronic system including the same.

SUMMARY

An ADC according to an exemplary embodiment of the present invention includes a first logic unit and a second logic unit. The first logic unit receives a plurality of thermometer codes and inverse thermometer codes generated based on an analog signal received by the ADC and generates a plurality of first digital codes that repeat a same pattern based on a transition position of a logic value in each of the thermometer codes and the inverse thermometer codes. The second logic unit receives the plurality of first digital codes and generates a plurality of second digital codes based on logic values of a plurality of bits among all bits of each of the first digital codes.

The first logic unit may determine the transition position of the logic value in each of the thermometer codes and the inverse thermometer codes based on a result of performing a logic operation on each of pairs of adjacent bits in each of the thermometer codes and the inverse thermometer codes. The first logic unit may include a plurality of XOR gates each of which performs an XOR operation on each pair of adjacent bits in each of the thermometer codes and the inverse thermometer codes.

The first logic unit may further include an XOR gate which performs an XOR operation on a most significant bit of each of the thermometer codes and the inverse thermometer codes and a first logic value or a second and different logic value. Alternatively, the first logic unit may further include an XOR gate which performs an XOR operation on a least significant bit of each of the thermometer codes and the inverse thermometer codes and the first logic value or the second logic value.

The second logic unit may output logic values of a plurality of bits in each of the first digital codes as logic values of bits of one of the second digital codes. The second logic unit may include a plurality of OR gates each of which performs an OR operation on a logic value of one of the plurality of bits in each first digital code and a first logic value. Alternatively, the second logic unit may include a plurality of AND gates each of which performs an AND operation on a logic value of one of the plurality of bits in each first digital code and a second and different logic value.

The ADC may further include a folding block configured to receive the analog signal and to generate folding waveforms increasing and decreasing periodically and at regular intervals in response to the analog signal and a comparison block configured to receive the folding waveforms and to generate the thermometer codes and the inverse thermometer codes based on a result of comparing the folding waveforms with a plurality of reference voltages. The ADC may further include an interpolation block configured to receive the folding waveforms and to generate interpolated folding waveforms by interpolating the folding waveforms.

An electronic system according to an exemplary embodiment of the present invention includes a first logic unit, a second logic unit, and a digital signal processor. The first logic unit is configured to receive a plurality of thermometer codes generated based on an analog signal and to generate a plurality of first digital codes that periodically repeat the same pattern based on a transition position of a logic value in each of the thermometer codes. The thermometer codes increase in value for a first period and decrease in value for a second period. The second logic unit is configured to receive the plurality of first digital codes and to generate a plurality of second digital codes based on logic values of a plurality of bits among all bits of each of the first digital codes. The digital signal processor is configured to perform a signal processing on the second digital codes to generate a processed digital signal.

The first logic unit may be configured to determine the transition position of the logic value in each of the thermometer codes based on a result of performing a logic operation on each of pairs of adjacent bits in each of the thermometer codes. The first logic unit may include a plurality of XOR gates each of which performs an XOR operation on each pair of adjacent bits in each of the thermometer codes. In an exemplary embodiment, all but one of the XOR gates receives a unique pair of adjacent bits of the thermometer code and the remaining XOR gate receives either a most significant bit of the thermometer code and a preset logic value or a least significant bit of the thermometer code and a preset logic value to generate a digital code. The second logic unit may include a plurality of OR gates numbering less than the XOR gates, each OR gate receiving one of a plurality of bits of the digital code and a preset logic value. The electronic system may further include a digital-analog-converter to convert the processed signal digital signal to an analog signal.

An analog-to-digital converter according to an exemplary embodiment of the present invention includes a plurality of folders, a plurality of comparators, a plurality of XOR gates, and a plurality of OR gates. The folders generate a plurality of folding waveforms in response to an analog signal. The folding waveforms have a same sinusoidal shape and are offset from one another. Each of the plurality of comparators respectively receives a corresponding one of the folding waveforms and a reference voltage to output a thermometer code. All but one of the XOR gates receives a unique pair of adjacent bits of the thermometer code and the remaining XOR gate receives either a most significant bit of the thermometer code and a preset logic value or a least significant bit of the thermometer code and a preset logic value to generate a digital code. Each OR gate receives one of a plurality of bits of the digital code and a preset logic value.

The comparators may correspond in number to the number of folders, the thermometer code may have bits corresponding in number to the number of comparators, the XOR gates may correspond in number to the number of the comparators, and the number of OR gates may be less than the number of XOR gates. The preset logic value may be a logical 0. Each current folding waveform may be offset from a subsequent folding waveform by an equal amount. The analog-to-digital converter may further include an interpolation block to perform an interpolation on the folding waveforms.

BRIEF DESCRIPTION OF THE DRAWINGS

The present invention will become more apparent by describing in detail exemplary embodiments thereof with reference to the attached drawings in which:

FIG. 4 illustrates examples of an output signal of a comparison block illustrated in FIG. 1;

FIG. 6 illustrates exemplary output signals of the first logic unit illustrated in FIG. 5A or 5B with respect to the output signals of the comparison block illustrated in FIG. 4;

FIGS. 7B through 7D are exemplary diagrams showing a procedure for determining bits of an output signal of the second logic unit from an output signal of the first logic unit according to an exemplary embodiment of the present invention;

DETAILED DESCRIPTION OF EXEMPLARY EMBODIMENTS

Figure 1:
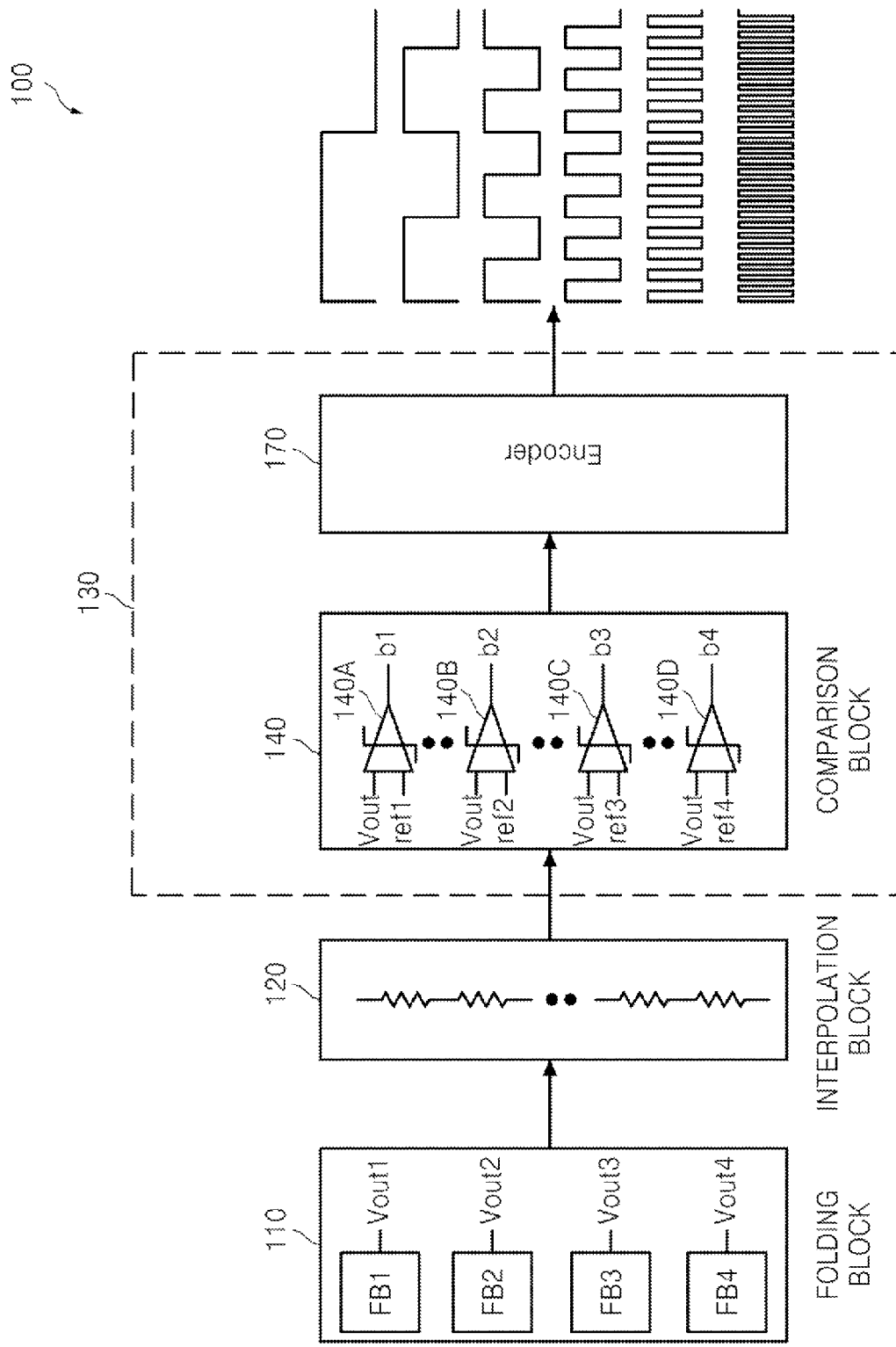
FIG. 1 is a block diagram of an analog-to-digital converter (ADC) according to an exemplary embodiment of the present invention.

The present invention now will be described more fully hereinafter with reference to the accompanying drawings, in which exemplary embodiments of the invention are shown. This invention may, however, be embodied in many different foams and should not be construed as limited to the exemplary embodiments set forth herein. Like numbers in the drawings refer to like elements throughout.

It will be understood that when an element is referred to as being "connected" or "coupled" to another element, it can be directly connected or coupled to the other element or intervening elements may be present.

FIG. 1 is a block diagram of an analog-to-digital converter (ADC) 100 according to an exemplary embodiment of the present invention. Referring to FIG. 1, the ADC 100 includes a folding block 110, an interpolation block 120, and a digital signal processor (DSP) 130.

The folding block 110 receives an analog signal and generates and outputs folding waveforms increasing and decreasing (e.g., in amplitude) periodically and at regular intervals in response to the analog signal. For example, the folding waveforms may have a sinusoidal shape. The folding block 110 may include a plurality of folders FB1, FB2, FB3, and FB4 generating folding waveforms Vout1, Vout2, Vout3, and Vout4, respectively, based on the received analog signal. The folding waveforms Vout1, Vout2, Vout3, and Vout4 may be the same waveform (i.e., have the same shape) but only offset from one another. Each subsequent folding waveform (e.g., Vout2) may be offset an equal amount from a preceding folding waveform (e.g., Vout1). Although the folding block 110 includes four folders in the embodiment illustrated in FIG. 1, the present invention is not restricted thereto, as a fewer or greater number of folders may be included within the folding block 110.

The interpolation block 120 receives and interpolates folding waveforms Vout1 through Vout4, thereby generating interpolated folding waveforms. For example, the interpolation block 120 can interpolate between folding waveforms Vout1 and Vout2, between Vout2 and Vout3, and between Vout3 and Vout4. The interpolation block 120 may be an optional member of the ADC 100. The interpolation block 120 may be implemented by a resistor string for linear interpolation, but the present invention is not restricted thereto.

The DSP 130 generates digital codes based on the folding waveforms Vout1 through Vout4. The DSP 130 includes a comparison block 140 and an encoder 170. The comparison block 140 may include a plurality of comparators 140A, 140B, 140C, and 140D, which receive the folding waveforms Vout1 through Vout4, respectively, and generate a plurality of thermometer code bits, respectively, and a plurality of inverse thermometer code bits, respectively, based on results of comparing the folding waveforms Vout1 through Vout4 with a plurality of reference voltages ref1, ref2, ref3, and ref4, respectively. The comparison block 140 includes the four comparators 140A through 140D to generate thermometer codes and inverse thermometer codes comprised of four bits b1, b2, b3, and b4 in the embodiment illustrated in FIG. 1, but the scope of the present invention is not restricted thereto. For example, the comparison block 140 may include a fewer or greater number of comparators. The encoder 170 encodes the thermometer codes and the inverse thermometer codes and generates digital codes that periodically repeat the same pattern.

Figure 2:
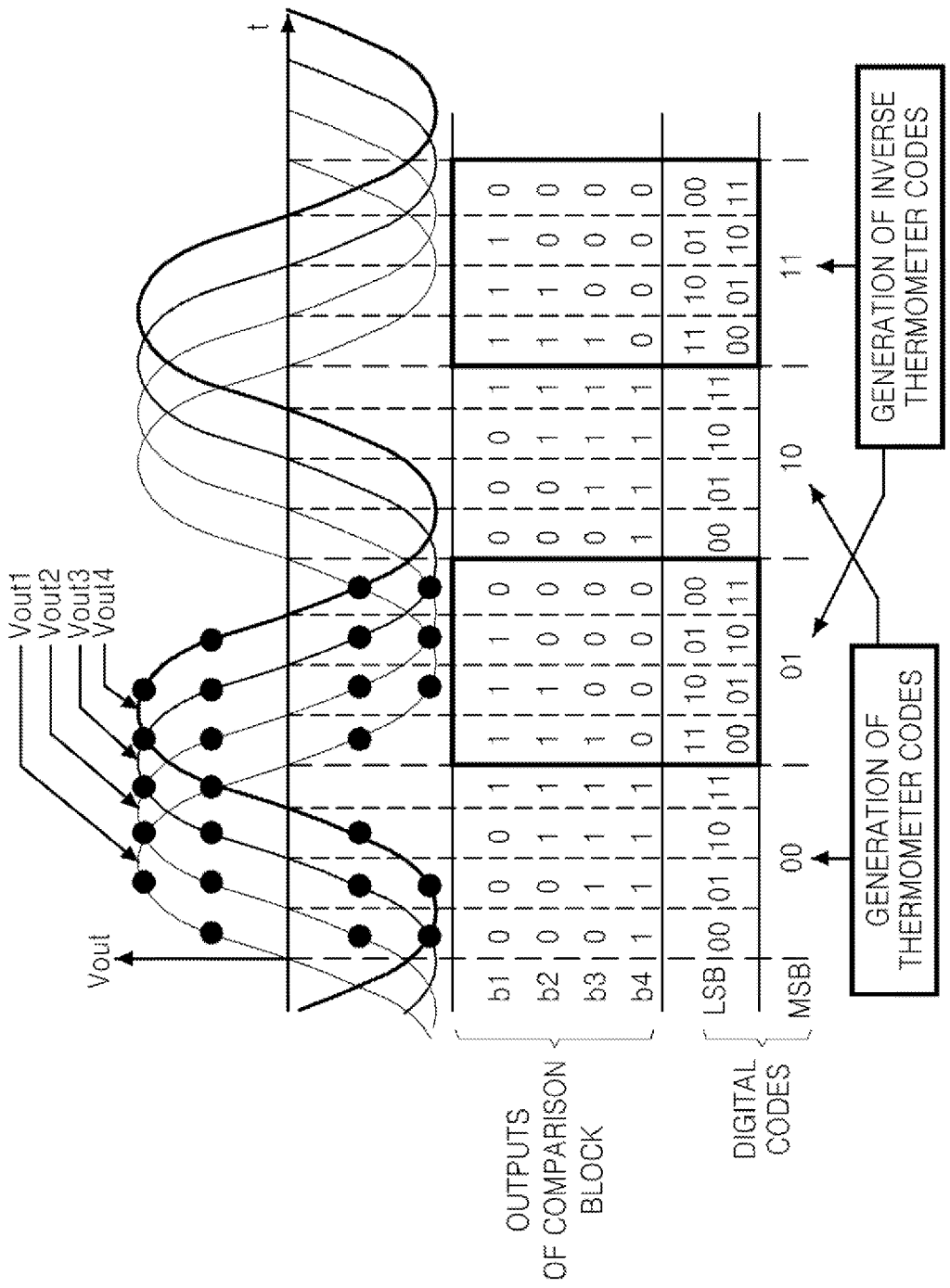
FIG. 2 is a diagram illustrating output signals of a folding block illustrated in FIG. 1 and processing of the output signals according to an exemplary embodiment of the present invention.

FIG. 2 is a diagram illustrating exemplary output signals Vout1 through Vout4 of the folding block 110 including the first through fourth folders FB1 through FB4 illustrated in FIG. 1 and processing of the output signals according to an exemplary embodiment of the present invention. Referring to FIGS. 1 and 2, the comparison block 140 generates thermometer codes and inverse thermometer codes, which include four bits b1, b2, b3, and b4, repeatedly increasing and decreasing at regular intervals based on the output signals Vout1 through Vout4 of the folding block 110.

The encoder 170 generates digital codes including most significant bits (MSBs) and least significant bits (LSBs) as results of encoding thermometer codes and inverse thermometer codes. Referring to FIG. 2, due to the architectural characteristics of a folding ADC, the LSBs corresponding to an inverse thermometer code may be inverted through additional signal processing. Unlike a conventional ADC, the ADC 100 according to at least one embodiment of the present invention does not need a switching block and a control block to invert an inverse thermometer code during encoding. A discussion below with reference to FIGS. 3 through 6 below explains why the switching block and control block are not needed in an ADC according to an exemplary embodiment of the present invention. Each of the ADC 100, the DSP 130, and the encoder 170 may be implemented in a single chip and installed using various types of packages.

Figure 3:
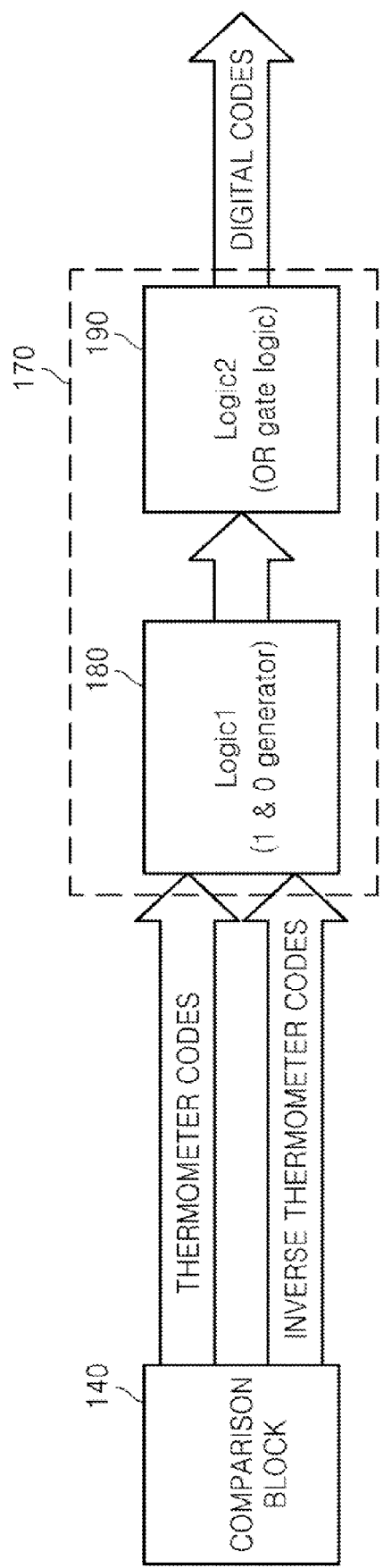
FIG. 3 is a block diagram of a digital signal processor illustrated in FIG. 1 according to an exemplary embodiment of the present invention.

FIG. 3 is a block diagram of the DSP 130 illustrated in FIG. 1 according to an exemplary embodiment of the present invention. Referring to FIG. 3, the encoder 170 included in the DSP 130 includes a first logic unit 180 and a second logic unit 190.

The first logic unit 180 receives a plurality of thermometer codes and a plurality of inverse thermometer codes and converts them into a plurality of first digital codes having the same repetitiveness based on the transition position of a logic value of each of the thermometer codes or the inverse thermometer codes. The first logic unit 180 may determine the transition position of the logic value of a thermometer code or an inverse thermometer code based on a result of performing a logic operation on each of the pairs of adjacent bits in the thermometer code or the inverse thermometer code.

Figure 5A:
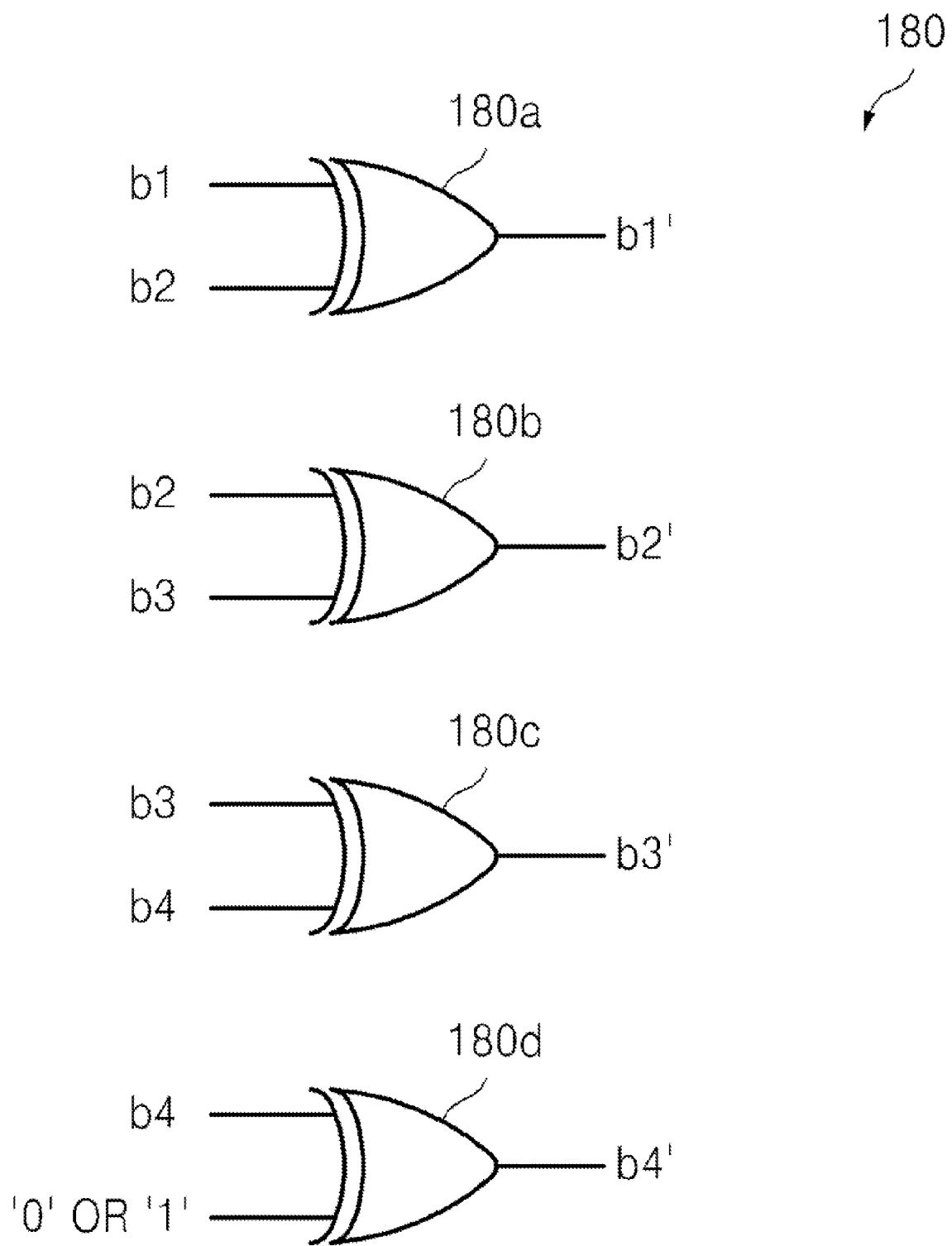
FIG. 5A is a circuit diagram of a first logic unit illustrated in FIG. 3 according to an exemplary embodiment of the present invention.

FIG. 4 illustrates examples of an output signal of the comparison block 140 illustrated in FIG. 1. FIG. 5A is a circuit diagram of the first logic unit 180 illustrated in FIG. 3 according to an exemplary embodiment of the present invention. FIG. 6 illustrates exemplary output signals of the first logic unit 180 illustrated in FIG. 5A with respect to the output signals of the comparison block 140 illustrated in FIG. 4.

Referring to FIG. 5A, the first logic unit 180 may include a plurality of XOR gates 180a, 180b, and 180c, each of which performs an XOR operation on two adjacent bits b1 and b2, b2 and b3, or b3 and b4 in a thermometer code or an inverse thermometer code, which includes the four bits b1, b2, b3, and b4. The first logic unit 180 may also include an XOR gate 180d, which performs an XOR operation on the LSB b4 of the thermometer code or the inverse thermometer code and a first logic value of "0" or a second logic value of "1".

Referring to FIG. 6, the output signal "b1'b2'b3'b4'" of the first logic unit 180 illustrated in FIG. 5 with respect to the output signal "b1b2b3b4" of the comparison block 140 illustrated in FIG. 4 is regularly repeated in a pattern of "0001", "0010", "0100", and "1000". While inversion of a thermometer code is performed by a switching block in a conventional ADC, here the inversion is performed by the first logic unit 180 in the ADC 100 according to at least one embodiment of the present invention. For example, when the first logic unit 180 encodes an inverse thermometer code of "0000", the first XOR gate 180a outputs "0", which is the result of performing an XOR operation on the MSB "b1" and the second bit "b2" in the inverse thermometer code "0000". The second XOR gate 180b outputs "0", which is the result of performing an XOR operation on the second bit "b2" and the third bit "b3" in the inverse thermometer code "0000". The third XOR gate 180c outputs "0", which is the result of performing an XOR operation on the third bit "b3" and the LSB "b4" in the inverse thermometer code "0000". The fourth XOR gate 180d outputs "1", which is the result of performing an XOR operation on the LSB "b4" in the inverse thermometer code "0000" and the second logic value of "1". Accordingly, the result of encoding the inverse thermometer code "0000" by the first logic unit 180 is "0001".

When the first logic unit 180 encodes a thermometer code of "1111", the first XOR gate 180a outputs "0", which is the result of performing an XOR operation on the MSB "b1" and the second bit "b2" in the thermometer code "1111". The second XOR gate 180b outputs "0", which is the result of performing an XOR operation on the second bit "b2" and the third bit "b3" in the thermometer code "1111". The third XOR gate 180c outputs "0", which is the result of performing an XOR operation on the third bit "b3" and the LSB "b4" in the thermometer code "1111". The fourth XOR gate 180d outputs "1", which is the result of performing an XOR operation on the LSB "b4" in the thermometer code "1111" and the first logic value of "0". Accordingly, the result of encoding the thermometer code "1111" by the first logic unit 180 is "0001" which is the same as the result of encoding the inverse thermometer code "0000" by the first logic unit 180.

Figure 5B:
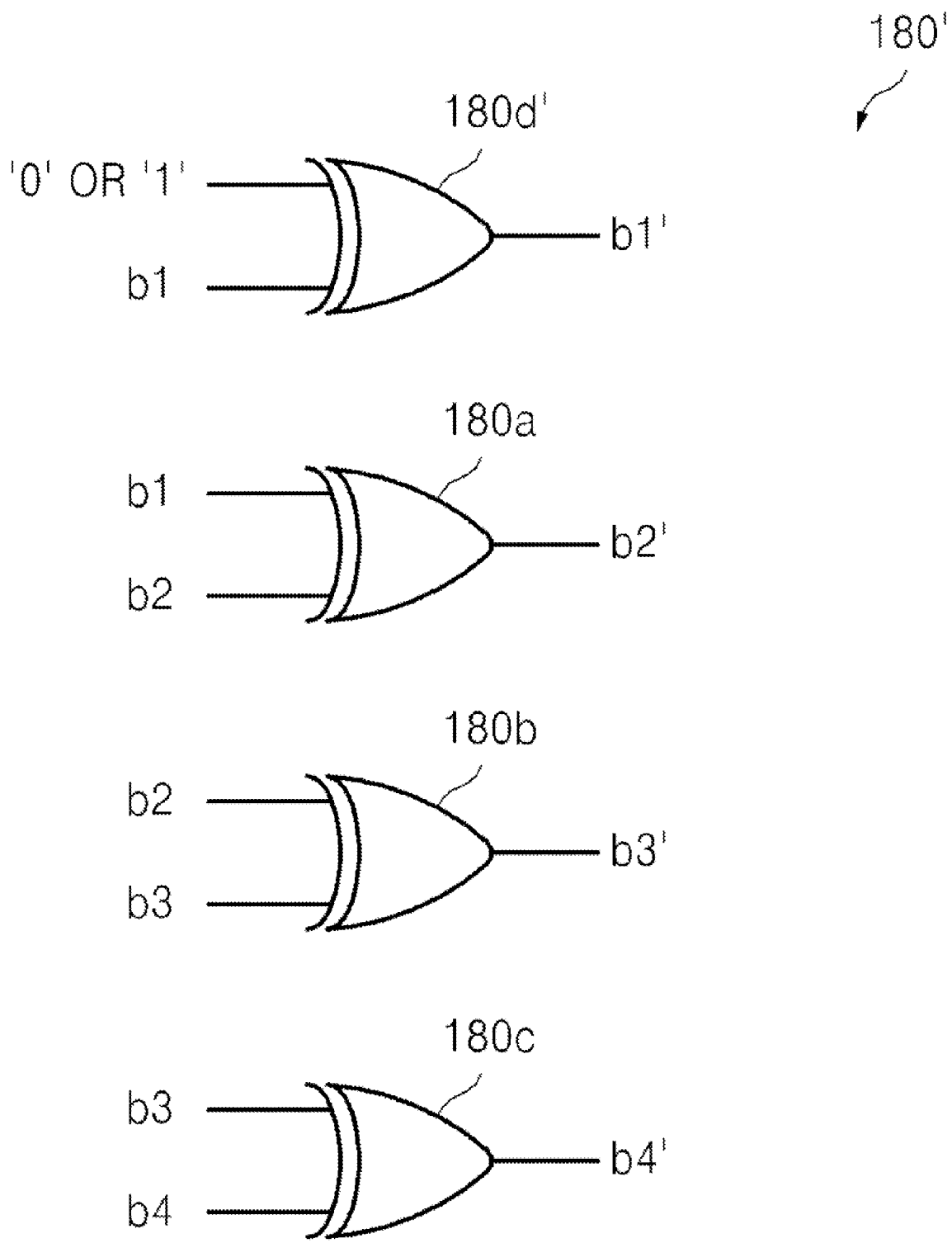
FIG. 5B is a circuit diagram of the first logic unit illustrated in FIG. 3 according to an exemplary embodiment of the present invention.

FIG. 5B is a circuit diagram of a first logic unit 180' according to an exemplary embodiment of the present invention. The first logic unit 180' illustrated in FIG. 5B may include a plurality of the XOR gates 180a, 180b, and 180c, each of which performs an XOR operation on two adjacent bits b1 and b2, b2 and b3, or b3 and b4 in a thermometer code (b1b2b3b4) or an inverse thermometer code (b1b2b3b4). However, different from the first logic unit 180 illustrated in FIG. 5A, the first logic unit 180' illustrated in FIG. 5B may further include an XOR gate 180d', which performs an XOR operation on the MSB b1 of the thermometer code or the inverse thermometer code and the first logic value of "0" or the second logic value of "1".

The second logic unit 190 receives a first digital code from the first logic unit 180 and generates a second digital code based on logic values of a plurality of bits among all bits of the first digital code. The second logic unit 190 may output the logic values of the plurality of bits of the first digital code as values of bits of the second digital code. The second logic unit 190 may include a plurality of OR gates that each perform an OR operation on a logic value of a bit in the first digital code and the first logic value of "0".

Figure 7A:
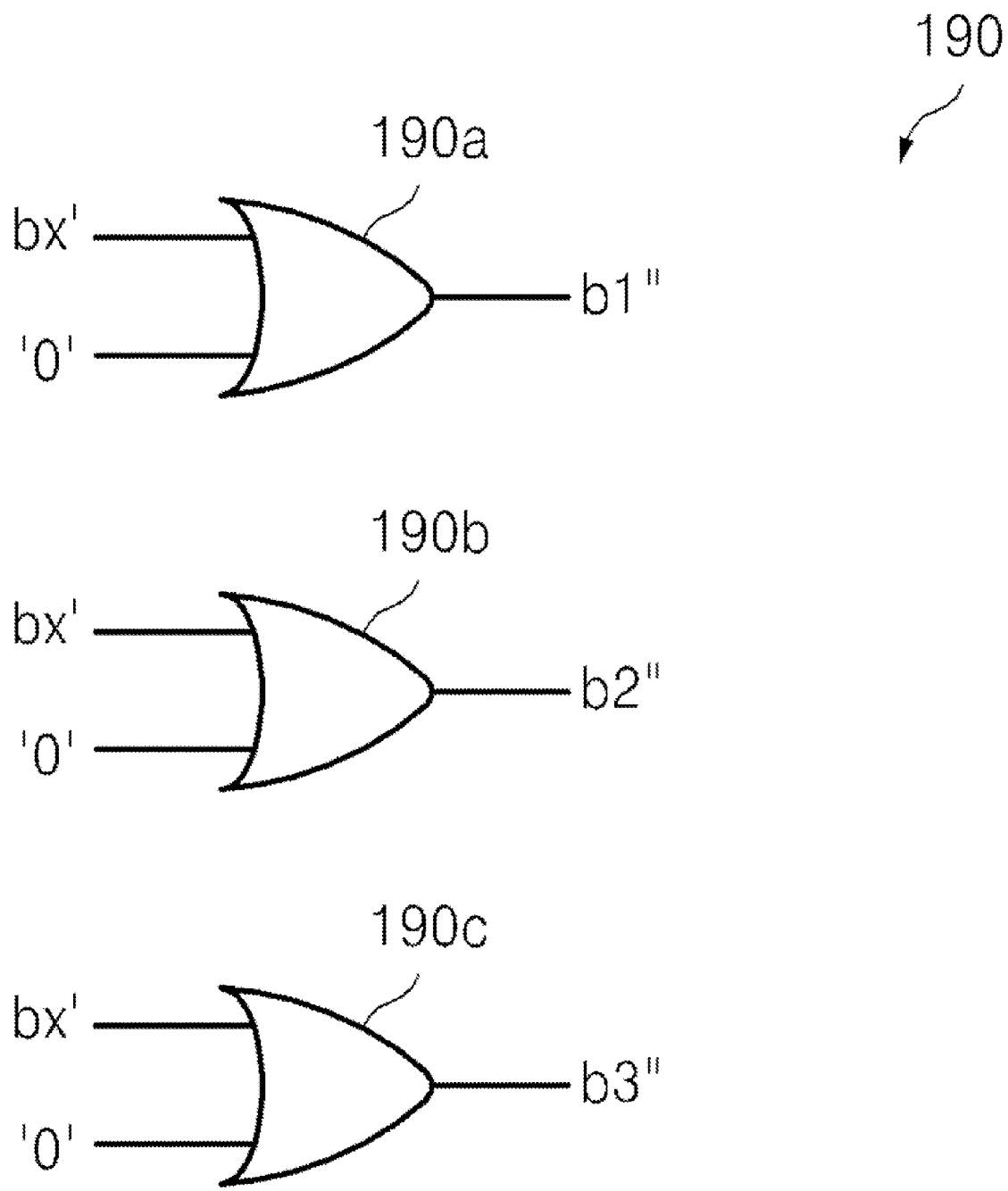
FIG. 7A is a circuit diagram of a second logic unit illustrated in FIG. 3 according to an exemplary embodiment of the present invention.

FIG. 7A is a circuit diagram of the second logic unit 190, which generates a second digital code of three bits with respect to a first digital code of seven bits. Referring to FIG. 7A, the second logic unit 190 includes a plurality of OR gates 190a, 190b, and 190c that each perform an OR operation on one bit bx' among a plurality of bits of the first digital code and the first logic value of "0" and thus generates a bit value of one of a plurality of bits b1", b2", and b3" of the second digital code. The bits bx' of the first digital code input to the OR gates 190a, 190b, and 190c, respectively, may be the same or different from one another according to the first digital code.

The second logic unit 190 may alternatively include a plurality of AND gates (not shown), each of which performs an AND operation on a logic value of one bit of the first digital code and the second logic value of "1", according to encoding methods.

FIGS. 7B through 7D are diagrams showing a procedure for determining the bits of an output signal of the second logic unit 190 from an output signal of the first logic unit 180. FIGS. 7B through 7D show an example in which a first digital code of seven bits is encoded into a second digital code of three bits.

FIG. 7B shows a procedure in which the second logic unit 190 determines the MSB b1" of a second digital code. With respect to first digital codes "0000000" through "0000100", the second logic unit 190 selects a logic value, i.e., "0" of one bit among bits b1' through b4' as a logic value of the MSB b1" of second digital codes. With respect to first digital codes "0001000" through "1000000", the second logic unit 190 selects a logic value, i.e., "1" of the bits b4', b3', b2', and b1' of the respective first digital codes "0001000" through "1000000" as the MSB b1" of second digital codes. Referring to FIGS. 7A and 7B, a portion of the second logic unit 190 for determining the MSB b1" of a second digital code may be implemented by the OR gate 190a, which performs an OR operation on a logic value of one bit among the bits b4', b3', b2', and b1' of a first digital code and the first logic value of "0".

FIG. 7C shows a procedure in which the second logic unit 190 determines the second bit b2" of a second digital code. For example, with respect to the first digital codes "0000000" and "0000001", the second logic unit 190 selects a logic value, i.e., "0" of one bit among bits b1', b2', b5', and b6' as a logic value of the second bit b2" of second digital codes. Referring to FIGS. 7A and 7C, a portion of the second logic unit 190 for determining the second bit b2" of a second digital code may be implemented by the OR gate 190b, which performs an OR operation on a logic value of one bit among the bits b1', b2', b5', and b6' of a first digital code and the first logic value of "0".

FIG. 7D shows a procedure in which the second logic unit 190 determines the LSB b3" of a second digital code. For example, with respect to the first digital codes "0000000" and "0000001", the second logic unit 190 selects a logic value, i.e., "0" or "1" of one bit among bits b1', b3', b5', and b7' as a logic value of the LSB b3" of second digital codes. Referring to FIGS. 7A and 7D, a portion of the second logic unit 190 for determining the LSB b3" of a second digital code may be implemented by the OR gate 190c, which performs an OR operation on a logic value of one bit among the bits b1', b3', b5', and b7' of a first digital code and the first logic value of "0".

As described above, in an ADC 100 according to at least one embodiment of the present invention, the first logic unit 180 may be implemented by an XOR gate and the second logic unit 190 may be implemented by an OR gate during encoding. In other words, the ADC 100 uses logic gates having the same path and thus may be more efficient in high-speed operations than a conventional ADC. In addition, a plurality of bits of an encoded digital signal have the same delay in the ADC 100, and therefore, a probability of error occurrence during encoding may be decreased.

Figure 8:
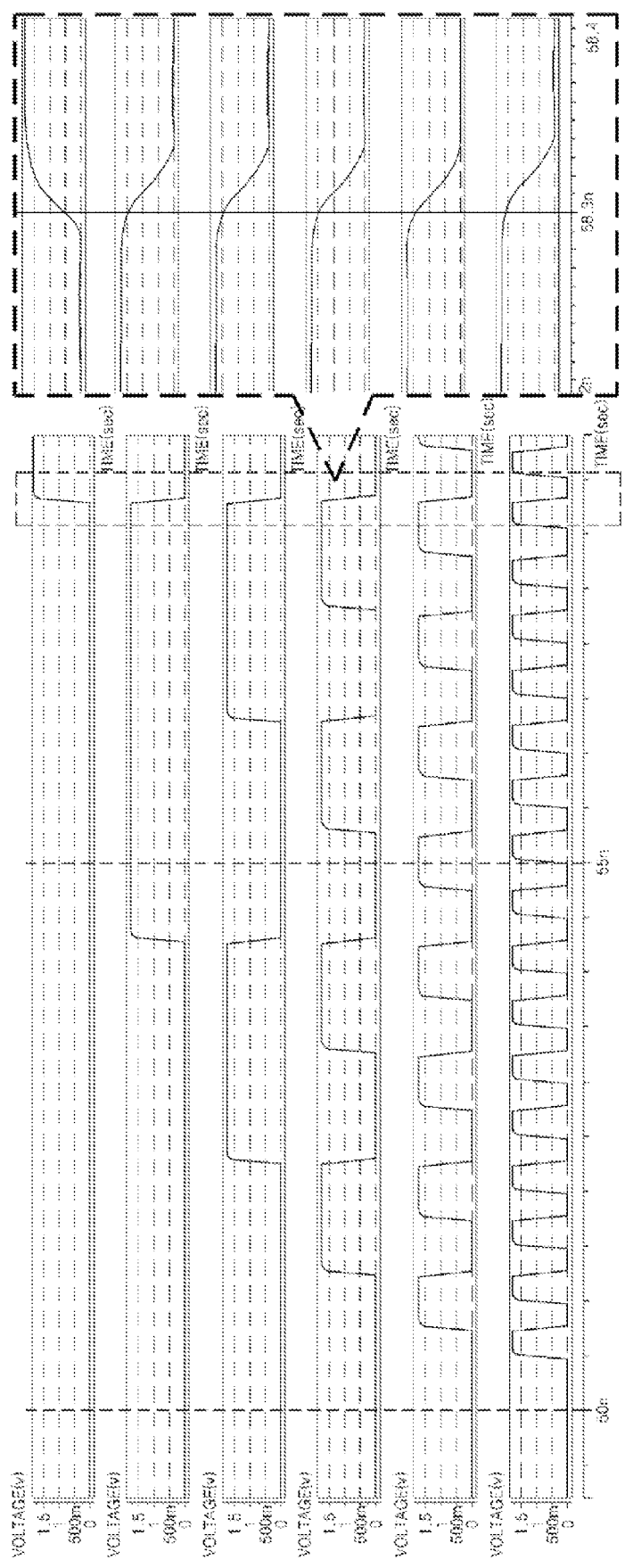
FIG. 8 is a graph showing simulation results of an output signal of an ADC according to an exemplary embodiment of the present invention.

FIG. 8 is a graph showing simulation results of an output signal of the ADC 100 according to an exemplary embodiment of the present invention. Referring to FIG. 8, the ADC 100 includes a 6-bit encoder as the encoder 170 and has an operating frequency of 4 GHz. Referring to an enlarged diagram framed by a dotted line in FIG. 8, the ADC 100 generates digital codes of which the bits have nearly the same delay characteristic even in an environment in which encoding is performed at a high data rate of 4 GHz. In addition, the encoder 170 according to at least one embodiment of the present invention does not need switching elements for encoding, thereby using less power and enabling the ADC to have a smaller area even when performing high frequency encoding with elements (e.g., transistors) similar to those used in a conventional encoder.

Figure 9:
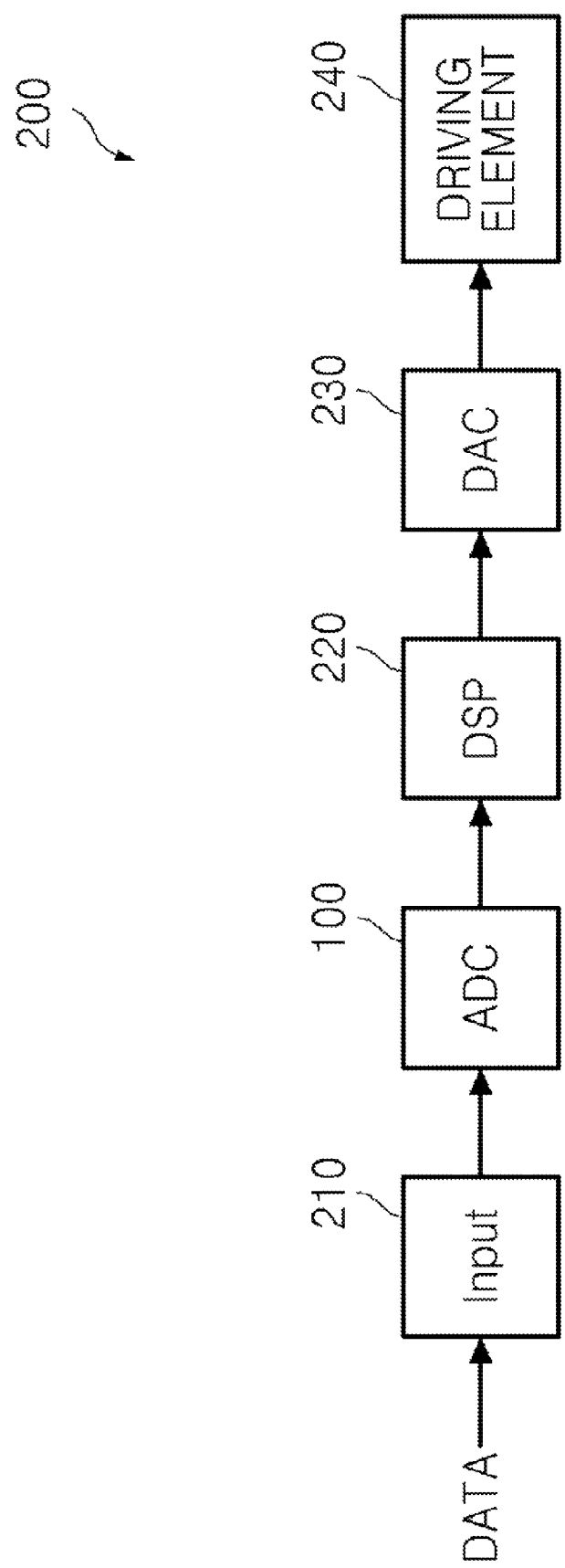
FIG. 9 is a block diagram of an electronic system according to an exemplary embodiment of the present invention.

FIG. 9 is a block diagram of an electronic system 200 according to an exemplary embodiment of the present invention. The electronic system 200 includes an input circuit 210, the ADC 100, a DSP 220, a digital-to-analog converter (DAC) 230, and a driving element 240.

The input circuit 210 receives and outputs an analog signal DATA for driving the driving element 240. The ADC 100 converts the analog signal received through the input circuit 210 into a digital signal and outputs the digital signal. The ADC 100 has been described with reference to FIGS. 1 through 8. Thus, a detailed description thereof will be omitted.

The DSP 220 receives the digital signal from the ADC 100 and performs signal processing on the digital signal. The DAC 230 converts the digital signal output from the DSP 220 into an analog signal for driving the driving element 240. The driving element 240 operates in response to the analog signal output from the DAC 230.

As described above, according to at least one exemplary embodiment of the present invention, an ADC does not need switching logic for inverting an inverse thermometer code, thereby reducing power consumption and an area of a chip. Further, deterioration of performance of the ADC due to false operations of the switching logic can be prevented.

While the present invention has been particularly shown and described with reference to exemplary embodiments thereof, it will be understood by those of ordinary skill in the art that various changes in forms and details may be made therein without departing from the spirit and scope of the disclosure.

What is claimed is:

1. An analog-to-digital converter comprising:
    a plurality of folders generating a plurality of folding waveforms in response to an analog signal, wherein the folding waveforms have a same sinusoidal shape and are offset from one another;
    a plurality of comparators, each comparator respectively receiving a corresponding one of the folding waveforms and a reference voltage to output a thermometer code;
    a plurality of XOR gates, wherein all but one of the XOR gates receives a unique pair of adjacent bits of the thermometer code and the remaining XOR gate receives either a most significant bit of the thermometer code and a preset logic value or a least significant bit of the thermometer code and a preset logic value to generate a digital code; and
    a plurality of OR gates, each OR gate receiving one of a plurality of bits of the digital code and a preset logic value.

2. The analog-to-digital converter of claim 1, wherein the comparators correspond in number to the number of folders, wherein the thermometer code has bits corresponding in number to the number of comparators, wherein the plurality of XOR gates correspond in number to the number of the comparators, and wherein the number of OR gates is less than the number of XOR gates.

3. The analog-to-digital converter of claim 1, wherein the preset logic value is a logical 0.

4. The analog-to-digital converter of claim 1, wherein each current folding waveform is offset from a subsequent folding waveform by an equal amount.

5. The analog-to-digital converter of claim 1, further comprising an interpolation block configured to perform an interpolation on the folding waveforms.

* * * * *